(12) United States Patent
Tanaka

(10) Patent No.: US 9,035,717 B2
(45) Date of Patent: May 19, 2015

(54) BALUN TRANSFORMER

(71) Applicant: Murata Manufacturing Co., Ltd., Nagaokakyo-shi, Kyoto-fu (JP)

(72) Inventor: Akira Tanaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 160 days.

(21) Appl. No.: 13/945,088

(22) Filed: Jul. 18, 2013

(65) Prior Publication Data
US 2014/0043108 A1 Feb. 13, 2014

(30) Foreign Application Priority Data
Aug. 9, 2012 (JP) .................................. 2012-176565

(51) Int. Cl.
*H01P 5/10* (2006.01)
*H01P 5/18* (2006.01)
*H03H 7/42* (2006.01)
*H03H 1/00* (2006.01)

(52) U.S. Cl.
CPC .. *H03H 7/42* (2013.01); *H01P 5/10* (2013.01); *H03H 7/422* (2013.01); *H03H 2001/0085* (2013.01)

(58) Field of Classification Search
CPC ................ H01P 5/10; H01P 5/18; H03H 7/42
USPC ....................... 333/109–112, 116–119, 25, 26
See application file for complete search history.

(56) References Cited

U.S. PATENT DOCUMENTS

| | | | |
|---|---|---|---|
| 5,644,272 A * | 7/1997 | Dabrowski | 333/26 |
| 5,949,299 A | 9/1999 | Harada | |
| 6,052,039 A | 4/2000 | Chiou et al. | |
| 7,847,653 B2 * | 12/2010 | Meharry | 333/25 |
| 8,314,663 B2 * | 11/2012 | Tamaru et al. | 333/109 |
| 8,358,179 B2 * | 1/2013 | Frye et al. | 333/26 |
| 8,629,736 B2 * | 1/2014 | Tamaru | 333/109 |
| 2001/0040495 A1 | 11/2001 | Morikawa | |
| 2005/0116787 A1 | 6/2005 | Ohi et al. | |
| 2009/0315636 A1 * | 12/2009 | Tamaru | 333/25 |

FOREIGN PATENT DOCUMENTS

| | | |
|---|---|---|
| JP | 09-260145 A | 10/1997 |
| JP | 10-200360 A | 7/1998 |

(Continued)

OTHER PUBLICATIONS

Official Communication issued in corresponding Japanese Patent Application No. 2012-176565 mailed on Jun. 17, 2014.

*Primary Examiner* — Dean Takaoka
(74) *Attorney, Agent, or Firm* — Keating & Bennett, LLP

(57) ABSTRACT

A balun transformer includes an unbalanced terminal, two balanced terminals, a directional coupler, a low pass filter, and a high pass filter. The directional coupler includes first, second, third and fourth terminals. The first terminal is connected to the unbalanced terminal. A predetermined phase difference exists between the output signal of the second terminal and the output signal of the third terminal. The second terminal is connected to the first terminal by a line constituting the directional coupler. The low pass filter is connected between the second terminal and one of the balanced terminals. The high pass filter is connected between the third terminal and the other balanced terminal.

20 Claims, 9 Drawing Sheets

(56) References Cited

FOREIGN PATENT DOCUMENTS

| | | |
|---|---|---|
| JP | 2002-217036 A | 8/2002 |
| JP | 2003-110314 A | 4/2003 |
| JP | 2005-166702 A | 6/2005 |
| JP | 2008-098769 A | 4/2008 |

* cited by examiner

| | BALUN TRANSFORMER 1 | BALUN TRANSFORMER 1F | BALUN TRANSFORMER 1M |
|---|---|---|---|
| INSERTION LOSS [dB] | 0.26 | 0.32 | 0.58 |
| CHANGE IN AMPLITUDE DIFFERENCE [dB] | 0.05 | 0.72 | 0.06 |
| PHASE DIFFERENCE [deg.] | 179.5 | 178.9 | 177.3 |

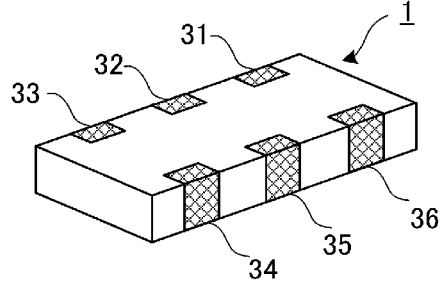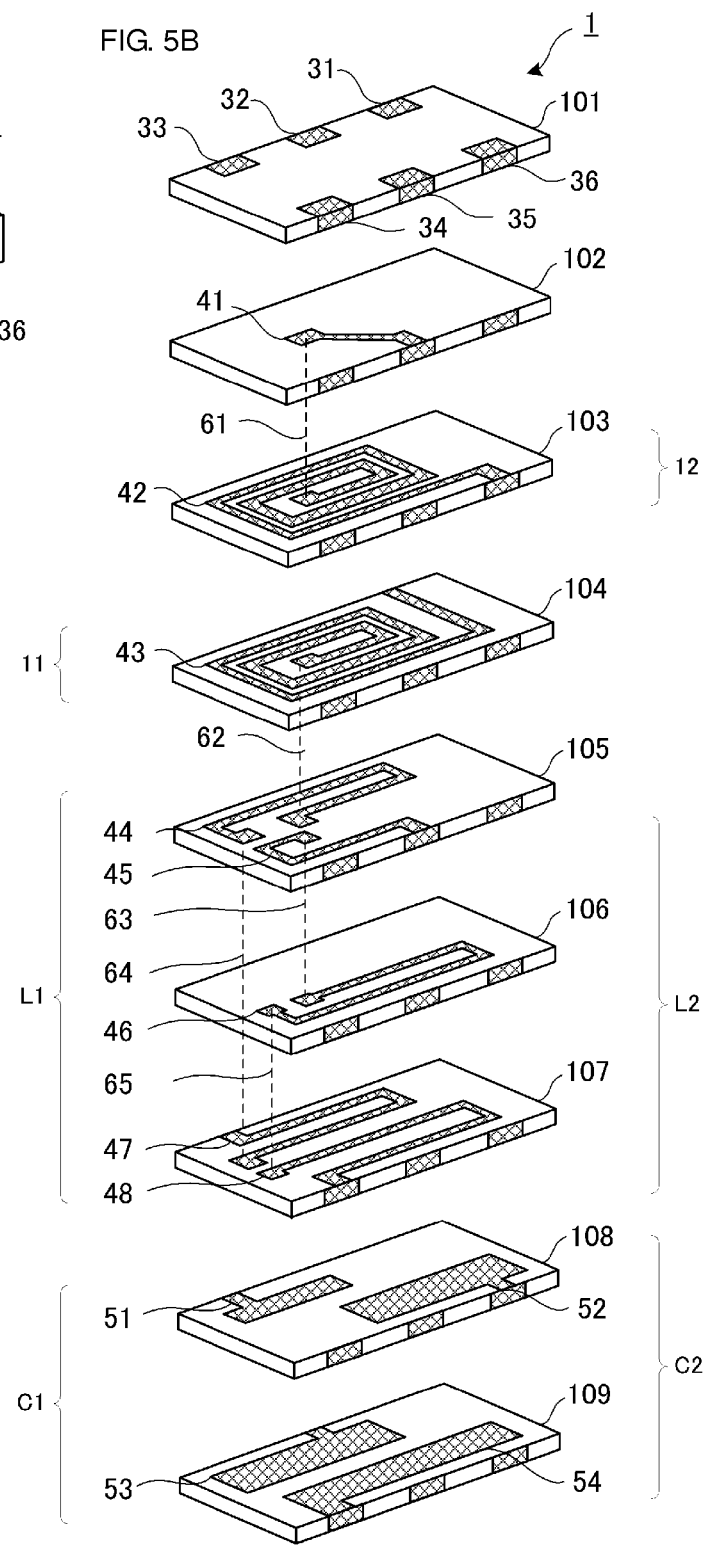

BALUN TRANSFORMER

BACKGROUND OF THE INVENTION

1. Field of the Invention

The present invention relates to a balun transformer that converts between a balanced signal and an unbalanced signal.

2. Description of the Related Art

A balun transformer is a circuit that converts between a balanced signal and an unbalanced signal. A balun transformer is formed by integrating various components together by using a multilayer substrate, and is implemented in a communication apparatus such as a cellular phone. As balun transformers according to related art, for example, there are balun transformers as illustrated in FIGS. 11 and 12.

FIG. 11 is a circuit diagram illustrating a balun transformer 1F according to related art (see Japanese Unexamined Patent Application Publication No. 2005-166702). The balun transformer 1F includes an unbalanced terminal P1, balanced terminals P2 and P3, a low pass filter 21F, and a high pass filter 22F. The low pass filter 21F is connected between the unbalanced terminal P1 and the balanced terminal P2. The high pass filter 22F is connected between the unbalanced terminal P1 and the balanced terminal P3.

In a case where an unbalanced signal is inputted to the unbalanced terminal P1, the signal passes through the low pass filter 21F and the high pass filter 22F. When the signal passes through the low pass filter 21F, the phase of the signal is delayed by about 90 degrees. When the signal passes through the high pass filter 22F, the phase of the signal advances by about degrees. Consequently, the signals outputted from the balanced terminals P2 and P3 are balanced signals that differ in phase from each other by about 180 degrees. Likewise, in a case where balanced signals are inputted to the balanced terminals P2 and P3, a signal outputted from the unbalanced terminal P1 is an unbalanced signal.

FIG. 12 is a circuit diagram illustrating a balun transformer 1M (Merchant type) according to related art (see Japanese Unexamined Patent Application Publication No. 2003-110314). The balun transformer 1M includes an unbalanced terminal P1, balanced terminals P2 and P3, and ¼-wave length transmission lines 11M, 12M, 13M, and 14M. One terminal 111M of the transmission line 11M is connected to the unbalanced terminal P1. The other terminal 112M of the transmission line 11M is connected to one terminal 121M of the transmission line 12M. The transmission line 13M is located adjacent to the transmission line 11M, and is electromagnetically coupled to the transmission line 11M. The transmission line 14M is located adjacent to the transmission line 12M, and is electromagnetically coupled to the transmission line 12M. One terminal 132M of the transmission line 13M is connected to the balanced terminal P2. One terminal 141M of the transmission line 14M is connected to the balanced terminal P3. The other terminal 131M of the transmission line 13M and the other terminal 142M of the transmission line 14M are connected to ground.

A signal inputted to the unbalanced terminal P1 is transmitted through the transmission lines 11M and 12M. Then, the input signal is transmitted through the transmission line 13M by way of the electromagnetic coupling between the transmission lines 11M and 13M. The input signal is also transmitted through the transmission line 14M by way of the electromagnetic coupling between the transmission lines 12M and 14M. Signals outputted from the balanced terminals P2 and P3 are balanced signals that differ in phase from each other by about 180 degrees. In a case where balanced signals are inputted to the balanced terminals P2 and P3, a signal outputted from the unbalanced terminal P1 is an unbalanced signal.

In the case of the balun transformer 1F illustrated in FIG. 11, the phase of the signal is changed by means of the low pass filter 21F and the high pass filter 22F. FIG. 13 illustrates the transmission characteristics of the low pass filter and high pass filter. The vertical axis represents attenuation, and the horizontal axis represents frequency. A frequency f1 indicates the center frequency (operating point) of the frequency band being used.

The low pass filter 21F is designed so that the phase of the signal at the operating point is delayed by about 90 degrees. Moreover, as illustrated in FIG. 13, in the low pass filter 21F, the magnitude of the slope (hereinafter, the magnitude of the slope will be simply referred to as slope) of the attenuation characteristic becomes large at the operating point. That is, in the balun transformer 1F, when the low pass filter 21F is designed so that the phase of a signal that has passed through the low pass filter 21F is delayed by about 90 degrees, the slope of the attenuation characteristic of the low pass filter 21F becomes large.

The amplitude of a signal that has passed through a low pass filter is determined by the attenuation characteristic of the low pass filter at the frequency of the signal. Consequently, in the balun transformer 1F, when the frequency of a signal fluctuates within the frequency band being used, the amount of change in the amplitude of the signal that has passed through the low pass filter 21F becomes large.

The high pass filter 22F is designed so that the phase of the signal at the operating point advances by about 90 degrees. Moreover, as illustrated in FIG. 13, the slope of the attenuation characteristic at the operation point is large also in the high pass filter 22F. Consequently, in the balun transformer 1F, when the frequency of a signal fluctuates within the frequency band being used, the amount of change in the amplitude of the signal that has passed through the high pass filter 22F becomes large.

Therefore, when the frequency of a signal fluctuates within the frequency band being used, a large difference appears between the amplitudes of two balanced signals in the balun transformer 1F.

In the case of the balun transformer 1M illustrated in FIG. 12, the side of the circuit having the unbalanced terminal P1 and the side of the circuit having the balanced terminals P2 and P3 are electromagnetically coupled to each other. Therefore, the insertion loss is large in comparison to a case where the unbalanced terminal P1 and each of the balanced terminals P2 and P3 are directly connected by a wire.

SUMMARY OF THE INVENTION

Accordingly, preferred embodiments of the present invention provide a balun transformer that has low insertion loss and an excellent balance characteristic of balanced signals.

According to a preferred embodiment of the present invention, a balun transformer is configured as described below. The balun transformer includes an unbalanced terminal, a first balanced terminal, a second balanced terminal, a directional coupler, a low pass filter, and a high pass filter. An unbalanced signal is inputted to and outputted from the unbalanced terminal. A balanced signal is inputted to and outputted from each of the first and second balanced terminals. The directional coupler includes a first terminal, a second terminal, a third terminal, and a fourth terminal. The first terminal of the directional coupler is connected to the unbalanced terminal. A predetermined phase difference exists between an output signal of the second terminal of the directional coupler and an output signal of the third terminal of the directional coupler. The second terminal of the directional coupler is connected to the first terminal of the directional coupler by a line that constitutes the directional coupler. The low pass filter is connected between the second terminal of the directional coupler and the first balanced terminal. The high pass filter is connected between the third terminal of the directional coupler and the second balanced terminal.

According to the above configuration, the unbalanced terminal and the first balanced terminal are connected by a wire. Consequently, it is possible to realize a balun transformer with low insertion loss in comparison to a Merchant type balun transformer described above. In addition, after the phase of a signal is changed by the directional coupler, the phase of the signal is further changed by each of the low pass filter and the high pass filter. Consequently, when changing the phase of a signal by each of the low pass filter and the high pass filter, the phase of the signal can be changed within a phase range in which the amplitude of the signal does not change greatly with respect to frequency. Therefore, it is possible to realize a balun transformer in which the difference in amplitude between two balanced signals is small.

According to a preferred embodiment of the present invention, the balun transformer may further include a capacitor, an inductor, and a direct current supply terminal. The capacitor is connected in series between the unbalanced terminal and the first terminal of the directional coupler. One end of the inductor is connected between the capacitor and the first terminal of the directional coupler. The direct current supply terminal is connected to another end of the inductor. According to this configuration, direct current is supplied to an electronic component such as an IC to which the balun transformer is connected.

According to a preferred embodiment of the present invention, the balun transformer may be configured as follows. The low pass filter includes a first inductor and a first capacitor. The high pass filter includes a second inductor and a second capacitor. The balun transformer further includes a dielectric layer, a first inductor electrode that defines the first inductor, a second inductor electrode that defines the second inductor, a first capacitor electrode that defines the first capacitor, a second capacitor electrode that defines the second capacitor, and a first transmission line electrode and a second transmission line electrode that defines the directional coupler. The balun transformer is formed preferably by laminating together the dielectric layer, the first inductor electrode, the second inductor electrode, the first capacitor electrode, the second capacitor electrode, the first transmission line electrode, and the second transmission line electrode. According to this configuration, the various components of the balun transformer can be integrated together by using a multilayer substrate so as to achieve miniaturization of the balun transformer.

According to a preferred embodiment of the present invention, in the balun transformer, the first transmission line electrode and the second transmission line electrode are preferably in a spiral or substantially spiral form, and overlap each other as viewed from a laminating direction. According to this configuration, the degree of coupling of the directional coupler is increased. Consequently, insertion loss is reduced.

According to a preferred embodiment of the present invention, in the balun transformer, the first inductor electrode and the second inductor electrode are laminated together, with the first transmission line electrode and the second transmission line electrode being sandwiched between the first inductor electrode and the second inductor electrode. According to this configuration, electromagnetic coupling between the low pass filter and the high pass filter is reduced.

According to various preferred embodiments of the present invention, it is possible to realize a balun transformer which has low insertion loss and in which a difference in amplitude between two balanced signals is small.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5A is a perspective view of the outward appearance of the balun transformer according to the first preferred embodiment of the present invention.

FIG. 5B is an exploded perspective view of the balun transformer according to the first preferred embodiment of the present invention.

DETAILED DESCRIPTION OF THE PREFERRED EMBODIMENTS

Figures 1, 2:
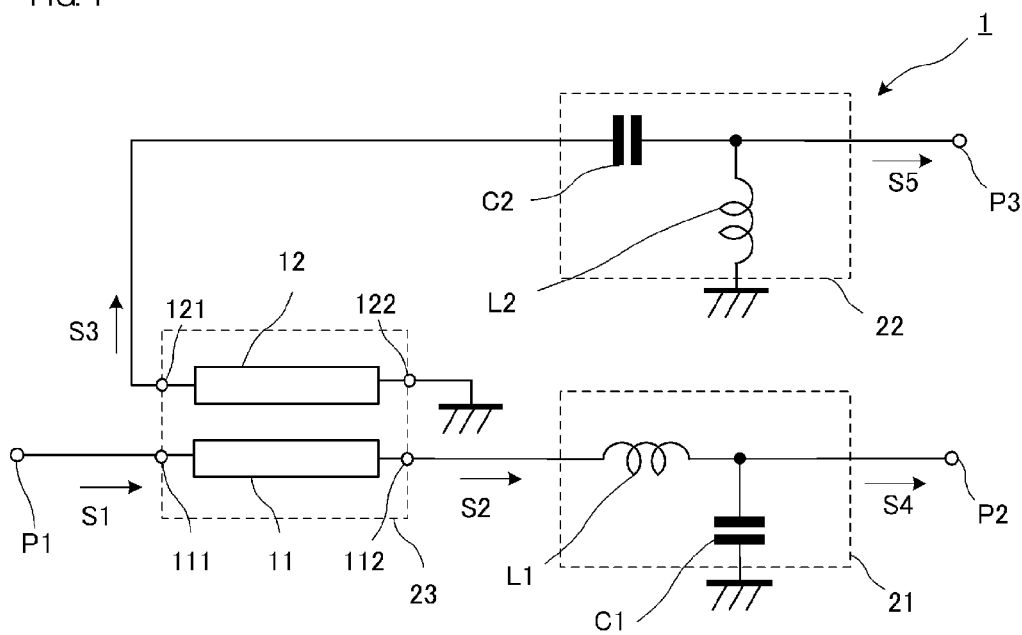
FIG. 1 is a circuit diagram of a balun transformer according to a first preferred embodiment of the present invention.
FIG. 2 is a table illustrating the characteristics of the balun transformer according to the first preferred embodiment and balun transformers according to related art.

A balun transformer 1 according to a first preferred embodiment of the present invention will be described. FIG. 1 is a circuit diagram of the balun transformer 1 according to the first preferred embodiment. The balun transformer 1 includes an unbalanced terminal P1, balanced terminals P2 and P3, transmission lines 11 and 12, capacitors C1 and C2, and inductors L1 and L2. The capacitor C1 and the inductor L1 constitute a low pass filter 21. The capacitor C2 and the inductor L2 constitute a high pass filter 22. The transmission lines 11 and 12 constitute a directional coupler 23.

One terminal 111 of the transmission line 11 is connected to the unbalanced terminal P1. The other terminal 112 of the transmission line 11 is connected to the balanced terminal P2 via the inductor L1. The connecting point of the inductor L1 and the balanced terminal P2 is connected to ground via the capacitor C1. The terminal 111 of the transmission line 11 corresponds to a first terminal of the directional coupler according to a preferred embodiment of the present invention. The terminal 112 of the transmission line 11 corresponds to a second terminal of the directional coupler according to a preferred embodiment of the present invention.

The transmission line 12 is located adjacent to the transmission line 11, and is electromagnetically coupled to the transmission line 11. One terminal 122 of the transmission line is connected to ground. The other terminal 121 of the transmission line 12 is connected to the balanced terminal P3 via the capacitor C2. The connecting point of the capacitor C2 and the balanced terminal P3 is connected to ground via the inductor L2. The terminal 121 of the transmission line 12 corresponds to a third terminal of the directional coupler according to a preferred embodiment of the present invention. The line length of each of the transmission lines 11 and 12 is one quarter the wave length of the signal to be transmitted. Consequently, the electric power of the signal transmitted through the transmission line 11 and the electric power of the signal transmitted through the transmission line 12 is made equal. In addition, preferably, the transmission lines 11 and 12 have as large a line width and a film thickness as possible. Consequently, the Q factor of the transmission lines 11 and 12 is increased.

An unbalanced signal S1 inputted to the unbalanced terminal P1 is transmitted through the directional coupler 23, and outputted as each of signals S2 and S3. The signals S2 and S3 are outputted from the terminal 112 of the transmission line 11 and the terminal 121 of the transmission line 12, respectively. The signal S3 has a phase that is advanced by about 90 degrees relative to the signal S2. The signal S2 passes through the low pass filter 21, and is outputted from the balanced terminal P2 as a signal S4. The inductance of the inductor L1 and the capacitance of the capacitor C1 are adjusted so that the phase of the signal that has passed through the low pass filter 21 is delayed by about 45 degrees. Therefore, as the signal S4 passes through the low pass filter 21, the phase of the signal S4 is delayed by about 45 degrees relative to the signal S2. The inductance of the inductor L2 and the capacitance of the capacitor C2 are adjusted so that the phase of the signal that has passed through the high pass filter 22 advances by about 45 degrees. Therefore, the signal S3 passes through the high pass filter 22, and is outputted from the balanced terminal P3 as a signal S5. As the signal S5 passes through the high pass filter 22, the phase of the signal S5 is advanced by about 45 degrees relative to the signal S3. Consequently, the signal S4 and the signal S5 become balanced signals that differ in phase from each other by about 180 degrees. Balanced signals inputted to the balanced terminals P2 and P3 travel along the above-mentioned path in the reverse direction, and are each outputted from the unbalanced terminal P1 as an unbalanced signal.

FIG. 2 is a table illustrating the characteristics of the balun transformer 1 according to the first preferred embodiment and balun transformers 1F and 1M according to related art. The insertion loss indicates the magnitude of insertion loss at the frequency at which the attenuation of each of the balun transformers becomes maximum within the frequency band being used (for example, about 2.4 GHz to 2.5 GHz). The change in amplitude difference indicates the amount of change in the amplitude difference between two balanced signals with respect to a change in the frequency of each of the balun transformers within the frequency band being used. The phase difference indicates the difference in phase between two balanced signals of each of the balun transformers within the frequency band being used.

Figure 11:
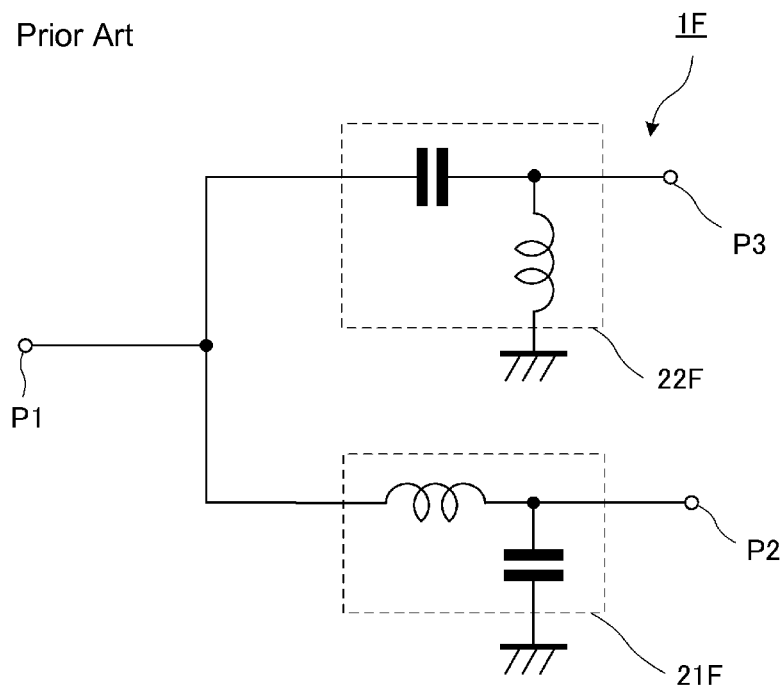
FIG. 11 is a circuit diagram illustrating a balun transformer according to related art.
Figure 12:
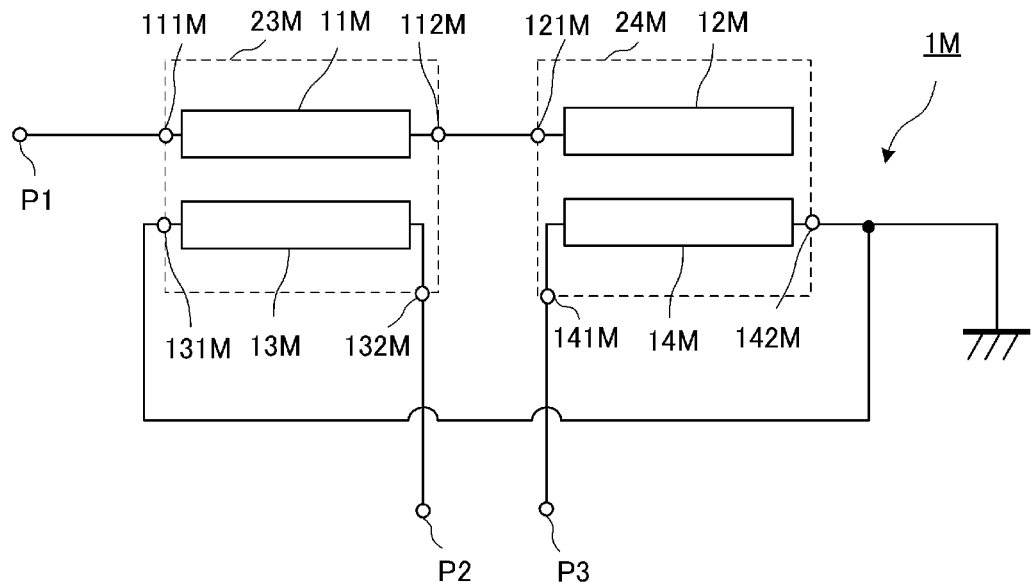
FIG. 12 is a circuit diagram illustrating a balun transformer according to related art.

As illustrated in FIG. 2, the balun transformer 1 has low insertion loss in comparison to related art. In addition, the balun transformer 1 has excellent amplitude balance and phase balance in comparison to related art. In particular, the balun transformer 1 can achieve low insertion loss in comparison to the balun transformer 1M illustrated in FIG. 12. Moreover, the balun transformer 1 can maintain excellent amplitude balance even when the frequency of a signal changes within the frequency band being used, in comparison to the balun transformer 1F illustrated in FIG. 11.

The above-mentioned results are due to the following reason. In the balun transformer 1M, the signal is transmitted between the side of the circuit having the unbalanced terminal P1 and the side of the circuit having the balanced terminals P2 and P3 solely via electromagnetic coupling. On the contrary, in the balun transformer 1, the unbalanced terminal P1 and the balanced terminal P2 are directly connected by a wire, without the intermediation of electromagnetic coupling. Consequently, power loss between the transmission lines decreases in comparison to the balun transformer 1M. Therefore, when the electric powers of the two balanced signals outputted from the balanced terminals P2 and P3 are combined, the balun transformer 1 has low insertion loss in comparison to the balun transformer 1M.

Figure 3A:
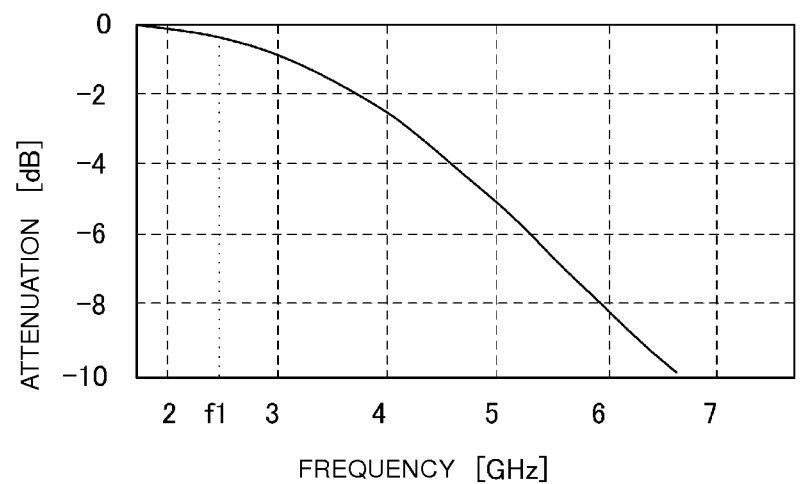
FIG. 3A illustrates the transmission characteristic of a low pass filter.
Figure 3B:
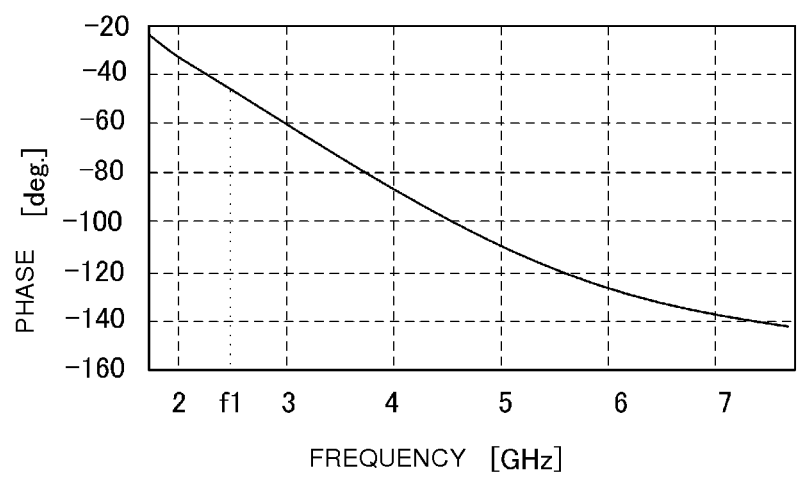
FIG. 3B illustrates the frequency characteristic of the phase of a signal that has passed through the low pass filter.

FIGS. 3A and 3B are characteristic diagrams of the low pass filter 21. FIG. 3A illustrates the transmission characteristic of the low pass filter 21. The vertical axis represents attenuation, and the horizontal axis represents frequency. FIG. 3B illustrates the frequency characteristic of the phase of the signal that has passed through the low pass filter 21. The vertical axis represents phase, and the horizontal axis represents frequency. A frequency f1 indicates the center frequency (operating point) of the frequency band being used.

Figure 13:
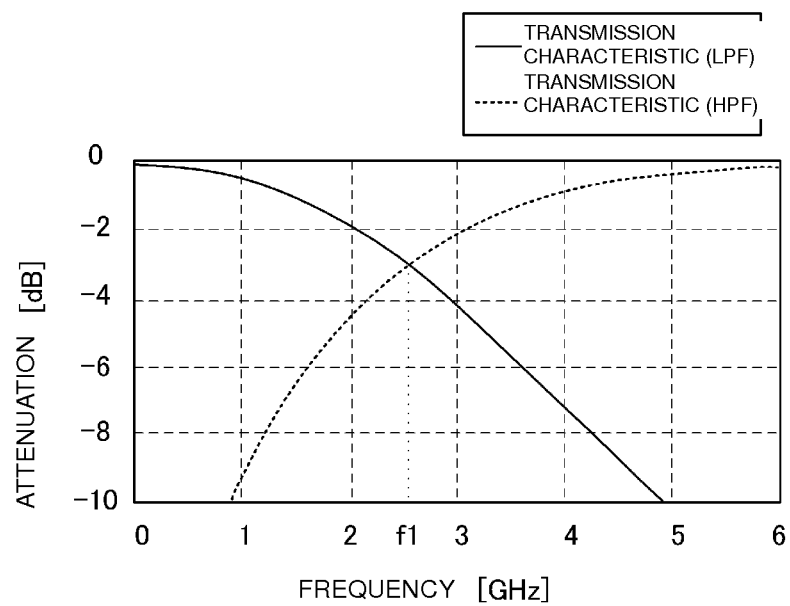
FIG. 13 illustrates the transmission characteristic of a low pass filter and a high pass filter.

As illustrated in FIG. 3B, the low pass filter 21 is designed so that the phase of the signal at the operating point is delayed by about 45 degrees. As described above, the low pass filter 21F is designed so that the phase of the signal at the operating point is delayed by about 90 degrees. As illustrated in FIG. 3A and FIG. 13, the magnitude of the slope (hereinafter, the magnitude of the slope will be simply referred to as slope) of the attenuation characteristic at the operating point of the low pass filter 21 is small in comparison to the slope of the attenuation characteristic at the operating point of the low pass filter 21F.

That is, the slope of the attenuation characteristic of the low pass filter 21 that delays the phase of the signal that has passed through the low pass filter 21 by about 45 degrees is small in comparison to the slope of the attenuation characteristic of the low pass filter 21F that delays the phase of the signal that has passed through the low pass filter 21F by about 90 degrees. This holds true even for low pass filters including a small number of inductors and capacitors.

The amplitude of the signal that has passed through a low pass filter is determined by the attenuation characteristic of the low pass filter at the frequency of the signal. For this reason, when the frequency of a signal fluctuates within the frequency band being used, the amount of change in the amplitude of the signal that has passed through the low pass filter 21 is small in comparison to the amount of change in the amplitude of the signal that has passed through the low pass filter 21F.

In the case of the high pass filters as well, the slope of the attenuation characteristic of the high pass filter 22 that advances the phase of the signal that has passed through the high pass filter 22 by about 45 degrees is small in comparison to the slope of the attenuation characteristic of the high pass filter 22F that advances the phase of the signal that has passed through the high pass filter 22F by about 90 degrees. For this reason, when the frequency of a signal fluctuates within the frequency band being used, the amount of change in the amplitude of the signal that has passed through the high pass filter 22 is small in comparison to the amount of change in the amplitude of the signal that has passed through the high pass filter 22F.

Therefore, the amount of change in the phase difference of the balun transformer 1 is small in comparison to the amount of change in the phase difference of the balun transformer 1F. That is, in comparison to the balun transformer 1F, the balun transformer 1 is able to maintain excellent amplitude balance even when the frequency of a signal changes within the frequency band being used.

Figure 4A:
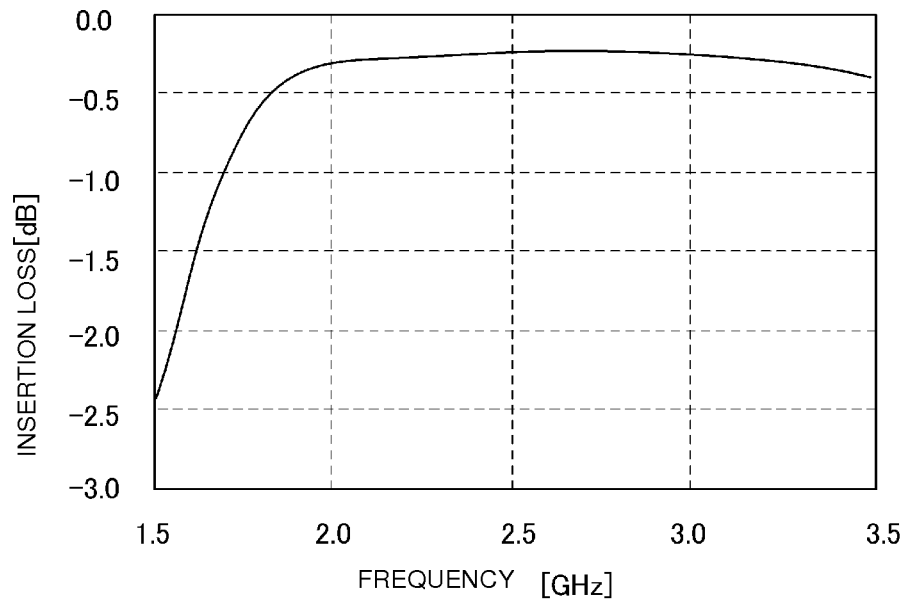
FIG. 4A illustrates the frequency characteristic of the insertion loss of the balun transformer according to the first preferred embodiment of the present invention.
Figure 4B:
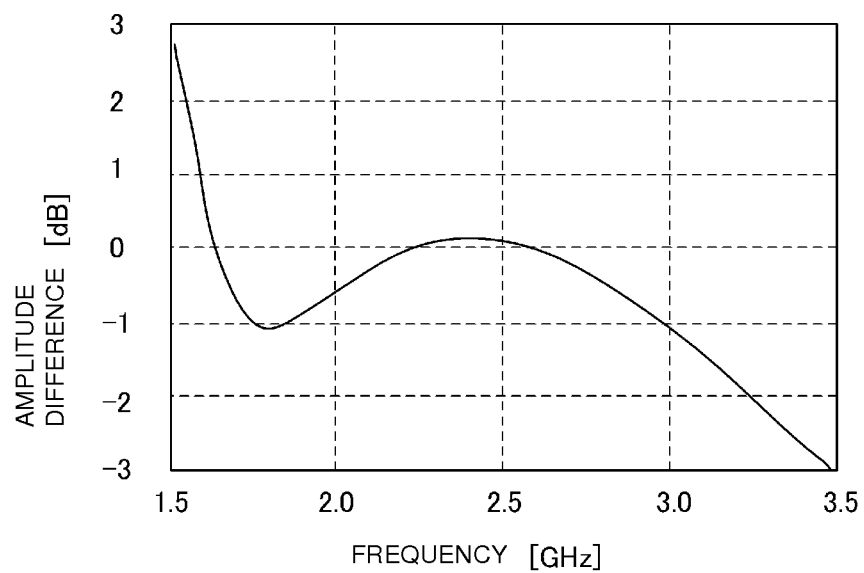
FIG. 4B illustrates the frequency characteristic of the amplitude difference of the balun transformer according to the first preferred embodiment of the present invention.

FIG. 4A illustrates the frequency characteristic of the insertion loss of the balun transformer 1 according to the first preferred embodiment. The vertical axis represents insertion loss, and the horizontal axis represents frequency. The insertion loss is about 0.26 dB within the frequency band being used (for example, about 2.4 GHz to 2.5 GHz), and is substantially constant. FIG. 4B illustrates the frequency characteristic of the amplitude difference of the balun transformer 1 according to the first preferred embodiment. The vertical axis represents the difference in amplitude between two balanced signals, and the horizontal axis represents frequency. Within the frequency band being used, the amplitude difference has a value close to zero, and is substantially constant. As illustrated in FIGS. 4A and 4B, the balun transformer 1 has an excellent frequency characteristic.

FIG. 5A is a perspective view of the outward appearance of the balun transformer 1 according to the first preferred embodiment. FIG. 5B is an exploded perspective view of the balun transformer 1 according to the first preferred embodiment. In the following description, in FIG. 5A, the surface that faces the right foreground side of the drawings will be referred to as first side surface, the surface opposite to the first side surface will be referred to as second side surface, the surface that faces up will be referred to as upper surface, and the surface that faces down will be referred to as lower surface. In addition, electrode patterns having a rectangular or substantially rectangular shape when viewed from the laminating direction will be referred to as plate electrodes, electrode patterns located on the surface of the balun transformer 1 will be referred to as outer electrodes, and other electrode patterns will be referred to as linear electrodes.

The balun transformer 1 is a laminate preferably having a rectangular or substantially rectangular parallelepiped shape. The balun transformer 1 includes outer electrodes 31 to 36 provided on its surface. The outer electrodes 31, 32, and 33 are spaced apart from each other by a predetermined distance, and located on the second side surface of the laminate. The outer electrode 32 is located between the outer electrodes 31 and 33. The outer electrodes 34, 35, and 36 are located on the first side surface of the laminate so as to be opposite to the outer electrodes 33, 32, and 31, respectively. The outer electrodes 31 to 36 are arranged so as to extend over to the upper and lower surfaces of the laminate. The outer electrode 31 corresponds to the unbalanced terminal P1, the outer electrodes 32 and 35 correspond to ground, the outer electrode 33 corresponds to the balanced terminal P2, and the outer electrode 34 corresponds to the balanced terminal P3.

The balun transformer 1 includes dielectric layers 101 to 109. The dielectric layers 101 to 109 are laminated in order of their numbers.

A linear electrode 41 is located on the dielectric layer 102. One end of the linear electrode 41 is connected to the outer electrode 35. A linear electrode 42 is located on the dielectric layer 103, and preferably has a spiral or substantially spiral shape. One end of the linear electrode 42 is connected to the outer electrode 36. The other end of the linear electrode 42 is connected to the other end of the linear electrode 41 by a via electrode 61. A linear electrode 43 is located on the dielectric layer 104, and preferably has a spiral or substantially spiral shape. One end of the linear electrode 43 is connected to the outer electrode 31. The linear electrodes 42 and 43 overlap each other as viewed from the laminating direction. The linear electrode 42 corresponds to the transmission line 12, and corresponds to a second transmission line electrode according to a preferred embodiment of the present invention. The linear electrode 43 corresponds to the transmission line 11, and corresponds to a first transmission line electrode according to a preferred embodiment of the present invention. That is, the directional coupler 23 preferably includes the linear electrodes 42 and 43.

Linear electrodes 44 and 45 are located on the dielectric layer 105. One end of the linear electrode 44 is connected to the other end of the linear electrode 43 by a via electrode 62. One end of the linear electrode 45 is connected to the outer electrode 35. A linear electrode 46 is located on the dielectric layer 106. One end of the linear electrode 46 is connected to the other end of the linear electrode 45 by a via electrode 63. Linear electrodes 47 and 48 are located on the dielectric layer 107. One end of the linear electrode 47 is connected to the outer electrode 33. One end of the linear electrode 48 is connected to the outer electrode 34. The other end of the linear electrode 47 is connected to the other end of the linear electrode 44 by a via electrode 64. The other end of the linear electrode 48 is connected to the other end of the linear electrode 46 by a via electrode 65. The linear electrodes 44 and 47 and the via electrode 64 constitutes the inductor L1, and each correspond to a first inductor electrode according to a preferred embodiment of the present invention. The linear electrodes 45, 46, and 48 and the via electrodes 63 and 65 constitute the inductor L2, and each correspond to a second inductor electrode according to a preferred embodiment of the present invention.

Plate electrodes 51 and 52 are located on the dielectric layer 108. The plate electrode 51 is connected to the outer electrode 33. The plate electrode 52 is connected to the outer electrode 36. Plate electrodes 53 and 54 are located on the dielectric layer 109. The plate electrode 53 is connected to the outer electrode 32. The plate electrode 54 is connected to the outer electrode 34. As the plate electrodes 51 and 53 overlap each other with the dielectric layer 108 therebetween, the capacitor C1 is provided. The plate electrodes 51 and 53 each correspond to a first capacitor electrode according to a preferred embodiment of the present invention. As the plate electrodes 52 and 54 overlap each other with the dielectric layer 108 therebetween, the capacitor C2 is provided. The plate electrodes 52 and 54 each correspond to a second capacitor electrode according to a preferred embodiment of the present invention.

According to the first preferred embodiment of the present invention, the various components of the balun transformer 1 can be integrated together by using a multilayer substrate, so as to achieve miniaturization of the balun transformer 1. In addition, the transmission lines 11 and 12 preferably have a spiral or substantially spiral shape, so as to increase the degree of coupling between the transmission line 11 and the transmission line 12. Consequently, insertion loss is significantly reduced or prevented. In addition, the transmission lines 11 and 12 are arranged to be spaced at a distance from the plate electrodes 51 and 53 that constitute the capacitor C1 and the plate electrodes 52 and 54 that constitute the capacitor C2, so as to prevent or significantly reduce the occurrence of a parasitic capacitance in the vicinity of the transmission lines 11 and 12. Consequently, the Q factor of the transmission lines 11 and 12 increases, so as to reduce insertion loss.

Figure 6:
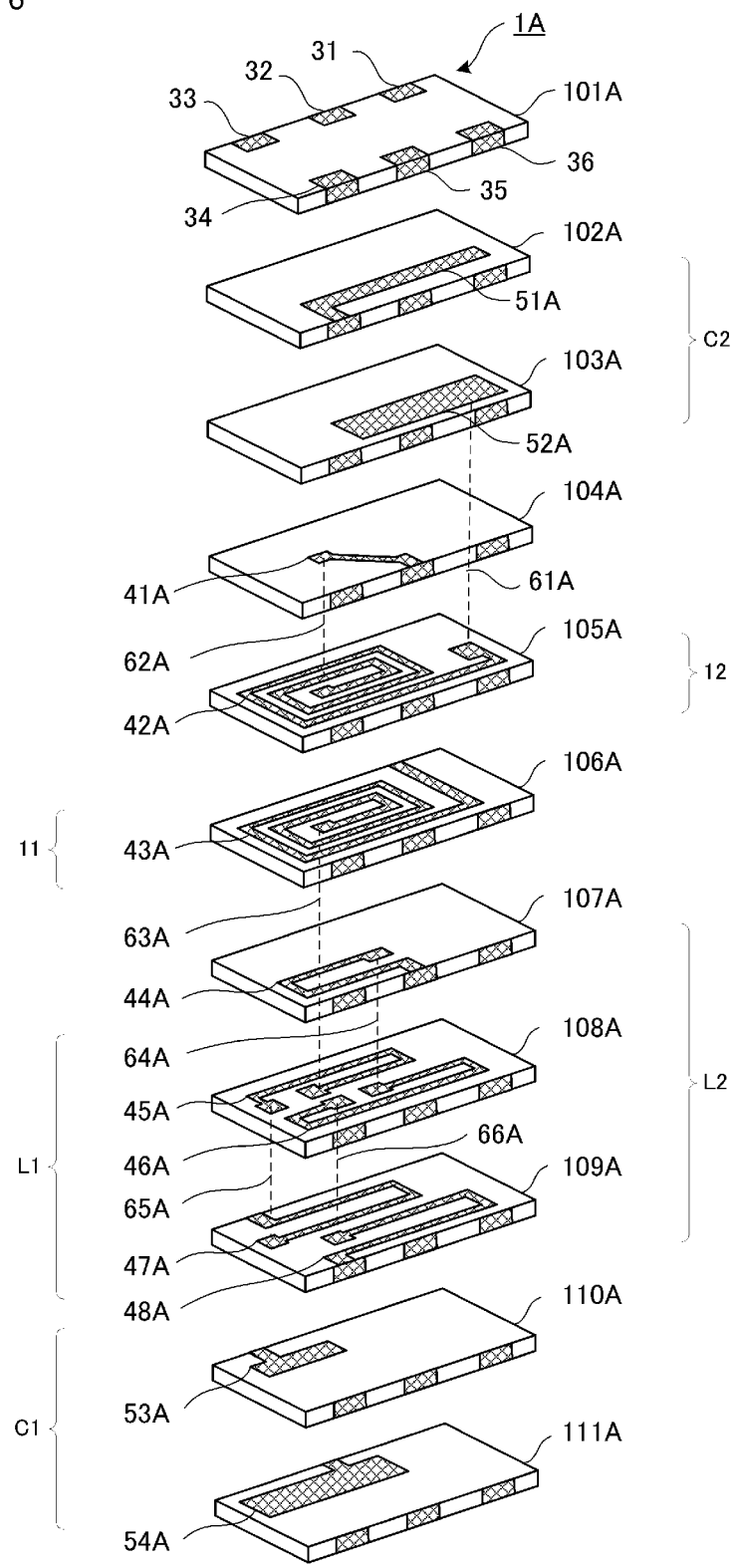
FIG. 6 is an exploded perspective view of a balun transformer according to a second preferred embodiment of the present invention.

A balun transformer 1A according to a second preferred embodiment of the present invention will be described. The circuit configuration and outward appearance of the balun transformer 1A according to the second preferred embodiment preferably is the same or substantially the same as those of the balun transformer 1 according to the first preferred embodiment of the present invention. Hereinafter, the laminated structure of the balun transformer 1A according to the second preferred embodiment will be described. FIG. 6 is an exploded perspective view of the balun transformer 1A according to the second preferred embodiment.

The balun transformer 1A includes dielectric layers 101A to 111A. The dielectric layers 101A to 111A are laminated in order of their numbers.

A plate electrode 51A is located on the dielectric layer 102A, and is connected to the outer electrode 34. A plate electrode 52A is located on the dielectric layer 103A. As the plate electrodes 51A and 52A overlap each other with the dielectric layer 103A therebetween, the capacitor C2 is provided. The plate electrodes 51A and 52A each correspond to the second capacitor electrode according to a preferred embodiment of the present invention.

A linear electrode 41A is located on the dielectric layer 104A. One end of the linear electrode 41A is connected to the outer electrode 35. A linear electrode 42A is located on the dielectric layer 105A, and preferably has a spiral or substantially spiral shape. One end of the linear electrode 42A is connected to the plate electrode 52A by a via electrode 61A. The other end of the linear electrode 42A is connected to the other end of the linear electrode 41A by a via electrode 62A. A linear electrode 43A is located on the dielectric layer 106A, and preferably has a spiral or substantially spiral shape. One end of the linear electrode 43A is connected to the outer electrode 31. The linear electrodes 42A and 43A overlap each other as viewed from the laminating direction. The linear electrode 42A corresponds to the transmission line 12, and corresponds to the second transmission line electrode according to a preferred embodiment of the present invention. The linear electrode 43A corresponds to the transmission line 11, and corresponds to the first transmission line electrode according to a preferred embodiment of the present invention.

A linear electrode 44A is located on the dielectric layer 107A. One end of the linear electrode 44A is connected to the outer electrode 35. Linear electrodes 45A and 46A are located on the dielectric layer 108A. One end of the linear electrode 45A is connected to the other end of the linear electrode 43A by a via electrode 63A. One end of the linear electrode 46A is connected to the other end of the linear electrode 44A by a via electrode 64A. Linear electrodes 47A and 48A are located on the dielectric layer 109A. One end of the linear electrode 47A is connected to the outer electrode 33. One end of the linear electrode 48A is connected to the outer electrode 34. The other end of the linear electrode 47A is connected to the other end of the linear electrode 45A by a via electrode 65A. The other end of the linear electrode 48A is connected to the other end of the linear electrode 46A by a via electrode 66A. The linear electrodes 45A and 47A and the via electrode 65A constitute the inductor L1, and each correspond to the first inductor electrode according to a preferred embodiment of the present invention. The linear electrodes 44A, 46A, and 48A and the via electrodes 64A and 66A constitute the inductor L2, and each correspond to the second inductor electrode according to a preferred embodiment of the present invention.

A plate electrode 53A is located on the dielectric layer 110A, and is connected to the outer electrode 33. A plate electrode 54A is located on the dielectric layer 111A, and is connected to the outer electrode 32. As the plate electrodes 53A and 54A overlap each other with the dielectric layer 110A therebetween, the capacitor C1 is provided. The plate electrodes 53A and 54A each correspond to the first capacitor electrode according to a preferred embodiment of the present invention.

According to the second preferred embodiment, it is possible to reduce insertion loss, and reduce the difference in amplitude between two balanced signals. In addition, the various components of the balun transformer 1A can be integrated together by using a multilayer substrate, so as to achieve miniaturization of the balun transformer 1A. Moreover, the transmission lines 11 and 12 preferably have a spiral or substantially spiral shape, so as to increase the degree of coupling between the transmission line 11 and the transmission line 12.

Figure 7:
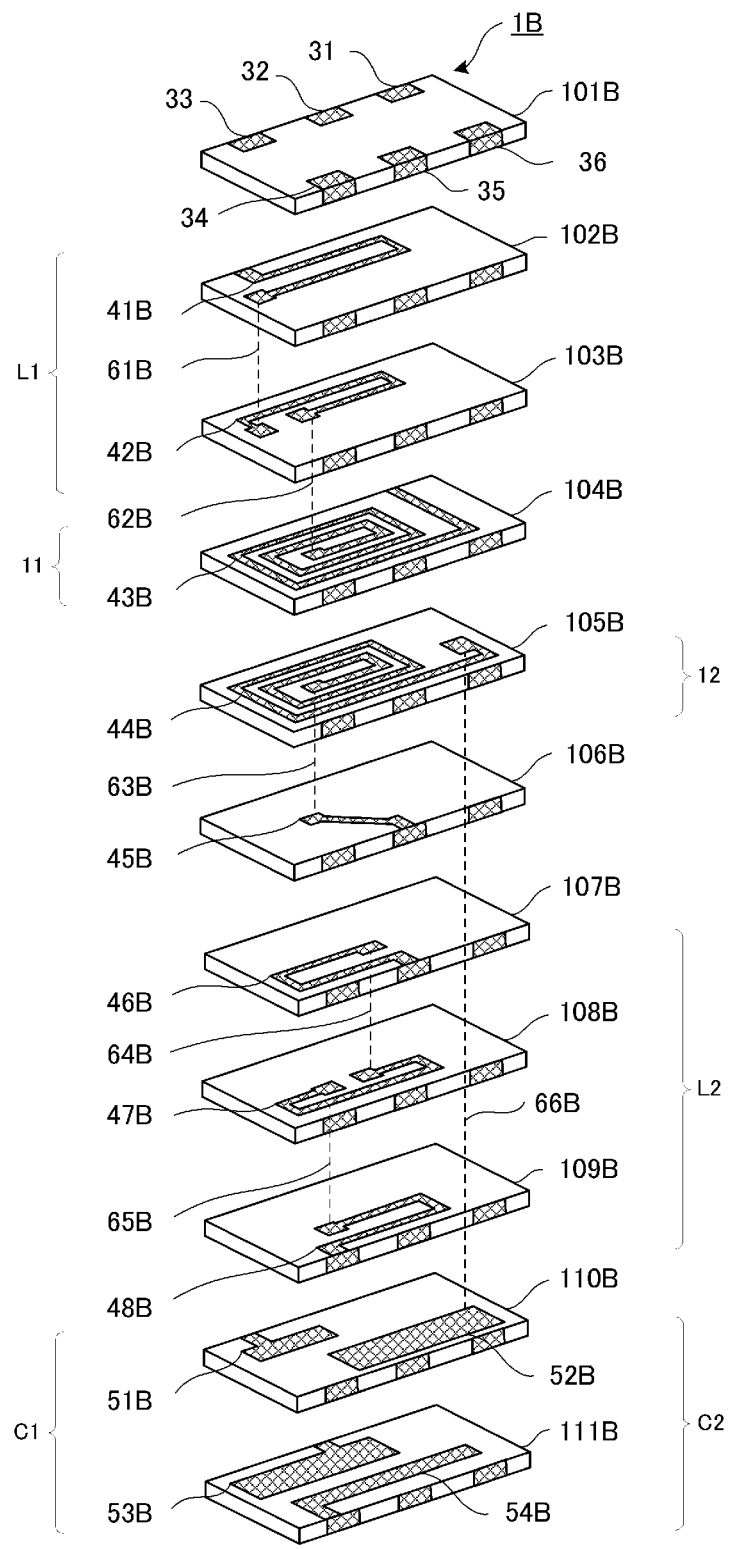
FIG. 7 is an exploded perspective view of a balun transformer according to a third preferred embodiment of the present invention.

A balun transformer 1B according to a third preferred embodiment of the present invention will be described. The circuit configuration and outward appearance of the balun transformer 1B according to the third preferred embodiment is preferably the same or substantially the same as those of the balun transformer 1A according to the second preferred embodiment. Hereinafter, the laminated structure of the balun transformer 1B according to the third preferred embodiment will be described. FIG. 7 is an exploded perspective view of the balun transformer 1B according to the third preferred embodiment.

The balun transformer 1B includes dielectric layers 101B to 111B. The dielectric layers 101B to 111B are laminated in order of their numbers.

A linear electrode 41B is located on the dielectric layer 102B. One end of the linear electrode 41B is connected to the outer electrode 33. A linear electrode 42B is located on the dielectric layer 103B. One end of the linear electrode 42B is connected to the other end of the linear electrode 41B by a via hole electrode 61B. The linear electrodes 41B and 42B and the via electrode 61B constitute the inductor L1, and each correspond to the first inductor electrode according to a preferred embodiment of the present invention.

A linear electrode 43B is located on the dielectric layer 104B, and preferably has a spiral or substantially spiral shape. One end of the linear electrode 43B is connected to the outer electrode 31. The other end of the linear electrode 43B is connected to the other end of the linear electrode 42B by a via electrode 62B. A linear electrode 44B is located on the dielectric layer 105B, and preferably has a spiral or substantially spiral shape. The linear electrodes 43B and 44B overlap each other as viewed from the laminating direction. A linear electrode 45B is located on the dielectric layer 106B. One end of the linear electrode 45B is connected to the outer electrode 35. The other end of the linear electrode 45B is connected to one end of the linear electrode 44B by a via electrode 63B. The linear electrode 43B corresponds to the transmission line 11, and corresponds to the first transmission line electrode according to a preferred embodiment of the present invention.

The linear electrode 44B corresponds to the transmission line 12, and corresponds to the second transmission line electrode according to a preferred embodiment of the present invention.

A linear electrodes 46B is located on the dielectric layer 107B. One end of the linear electrode 46B is connected to the outer electrode 35. A linear electrode 47B is located on the dielectric layer 108B. One end of the linear electrode 47B is connected to the other end of the linear electrode 46B by a via electrode 64B. A linear electrode 48B is located on the dielectric layer 109B. One end of the linear electrode 48B is connected to the outer electrode 34. The other end of the linear electrode 48B is connected to the other end of the linear electrode 47B by a via electrode 65B. The linear electrodes 46B, 47B, and 48B and the via electrodes 64B and 65B constitute the inductor L2, and each correspond to the second inductor electrode according to a preferred embodiment of the present invention.

Plate electrodes 51B and 52B are located on the dielectric layer 110B. The plate electrode 51B is connected to the outer electrode 33. The plate electrode 52B is connected to the other end of the linear electrode 44B by a via electrode 66B. Plate electrodes 53B and 54B are located on the dielectric layer 111B. The plate electrode 53B is connected to the outer electrode 32. The plate electrode 54B is connected to the outer electrode 34. As the plate electrodes 51B and 53B overlap each other with the dielectric layer 110B therebetween, the capacitor C1 is provided. The plate electrodes 51B and 53B each correspond to the first capacitor electrode according to a preferred embodiment of the present invention. As the plate electrodes 52B and 54B overlap each other with the dielectric layer 110B therebetween, the capacitor C2 is provided. The plate electrodes 52B and 54B each correspond to the second capacitor electrode according to a preferred embodiment of the present invention.

According to the third preferred embodiment, it is possible to reduce insertion loss, and reduce the difference in amplitude between two balanced signals. In addition, the various components of the balun transformer 1B can be integrated together by using a multilayer substrate, so as to achieve miniaturization of the balun transformer 1B. Moreover, the transmission lines 11 and 12 are preferably spiral or substantially spiral, so as to increase the degree of coupling between the transmission line 11 and the transmission line 12. Moreover, the transmission lines 11 and 12 are located between the inductor L1 and the inductor L2, and the inductor L1 and the inductor L2 are arranged so as to be spaced apart in the laminating direction. Consequently, electromagnetic coupling between the low pass filter 21 and the high pass filter 22 is reduced.

Figure 8:
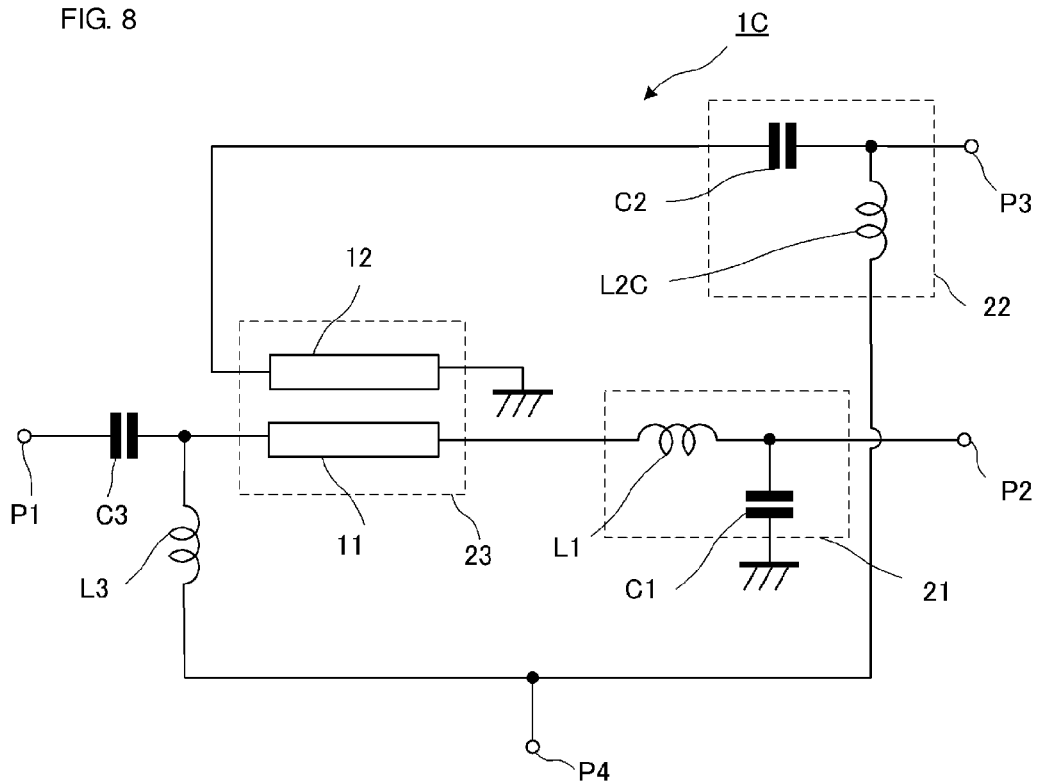
FIG. 8 is a circuit diagram illustrating a balun transformer according to a fourth preferred embodiment of the present invention.

A balun transformer 1C according to a fourth preferred embodiment of the present invention will be described. FIG. 8 is a circuit diagram of the balun transformer 1C according to the fourth preferred embodiment. Hereinafter, differences from the balun transformer 1 according to the first preferred embodiment will be described.

The balun transformer 1C according to the fourth preferred embodiment preferably includes a capacitor C3, an inductor L3, and a direct current supply terminal P4, in addition to the configuration of the balun transformer 1 according to the first preferred embodiment. In addition, the balun transformer 1C according to the fourth preferred embodiment includes an inductor L2C instead of the inductor L2 according to the first preferred embodiment.

The capacitor C3 is connected in series between the unbalanced terminal P1 and the transmission line 11. The connecting point of the capacitor C3 and the transmission line 11 is connected to the direct current supply terminal P4 via the inductor L3. The connecting point of the capacitor C2 and the balanced terminal P3 is connected to the direct current supply terminal P4 via the inductor L2C.

According to the fourth preferred embodiment, it is possible to reduce insertion loss, and reduce the difference in amplitude between two balanced signals. At the same time, direct current can be supplied to an electronic component such as an IC to which the balun transformer 1C is connected.

Figure 9:
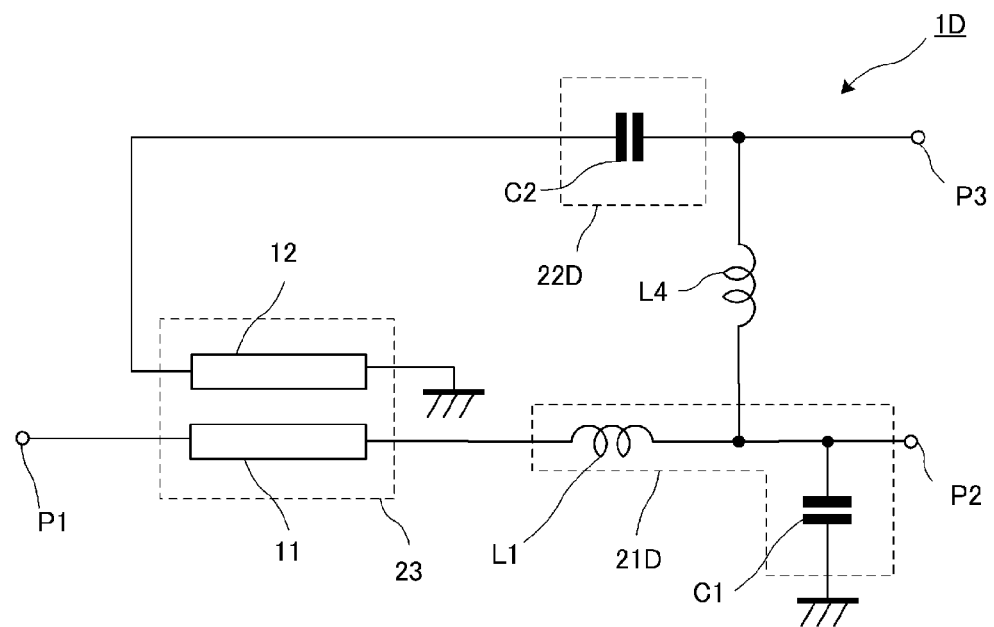
FIG. 9 is a circuit diagram illustrating a balun transformer according to a fifth preferred embodiment of the present invention.

A balun transformer 1D according to a fifth preferred embodiment of the present invention will be described. FIG. 9 is a circuit diagram of the balun transformer 1D according to the fifth preferred embodiment. Hereinafter, differences from the balun transformer 1 according to the first preferred embodiment will be described.

A low pass filter 21D is preferably defined by the inductor L1 and the capacitor C1. A high pass filter 22D is preferably defined by the capacitor C2. One end of the inductor L4 is connected between the capacitor C2 and the balanced terminal P3. The other end of the inductor L4 is connected between the inductor L1 and the capacitor C1.

According to the fifth preferred embodiment, it is possible to reduce insertion loss, and reduce the difference in amplitude between two balanced signals. In addition, by adjusting the inductance of the inductor L4, the phase of the impedance on the unbalanced terminal P1 side as seen from the balanced terminal P2, and the phase of the impedance on the unbalanced terminal P1 side as seen from the balanced terminal P3 can be rotated by the same amount. Consequently, the phase component of the output impedance of each of the balanced terminals P1 and P2 of the balun transformer 1D can be adjusted so as to match the phase component of the input impedance of an electronic component such as an IC that is connected to each of the balanced terminals P1 and P2.

Figure 10:
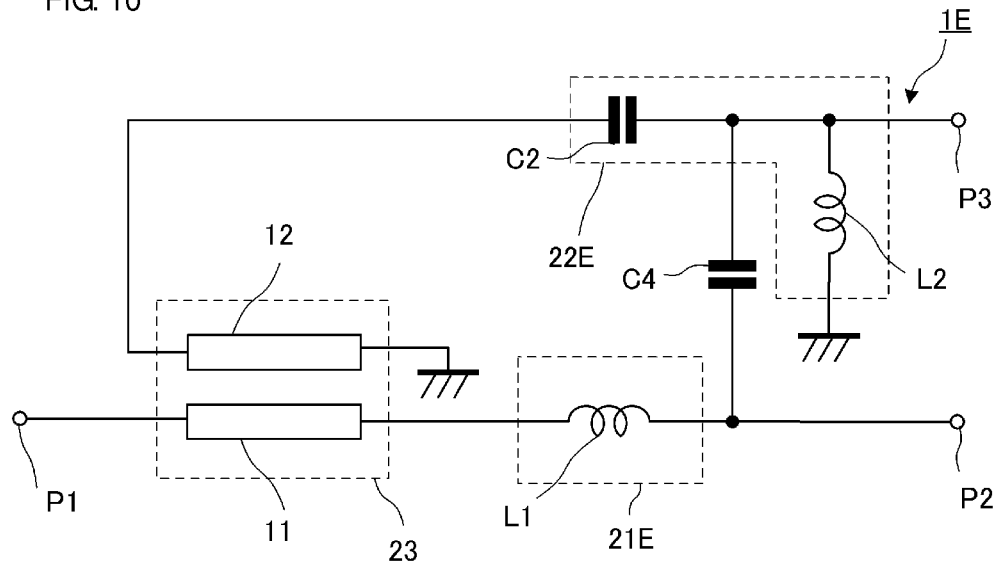
FIG. 10 is a circuit diagram illustrating a balun transformer according to a sixth preferred embodiment of the present invention.

A balun transformer 1E according to a sixth preferred embodiment of the present invention will be described. FIG. 10 is a circuit diagram of the balun transformer 1E according to the sixth preferred embodiment. Hereinafter, differences from the balun transformer 1 according to the first preferred embodiment will be described.

A low pass filter 21E is preferably defined by the inductor L1. A high pass filter 22E is preferably defined by the inductor L2 and the capacitor C2. One end of the capacitor C4 is connected between the capacitor C2 and the inductor L2. The other end of the capacitor C4 is connected between the inductor L1 and the balanced terminal P2.

According to the sixth preferred embodiment, it is possible to reduce insertion loss, and reduce the difference in amplitude between two balanced signals. In addition, by adjusting the capacitance of the capacitor C4, the phase of the impedance on the unbalanced terminal P1 side as seen from the balanced terminal P2, and the phase of the impedance on the unbalanced terminal P1 side as seen from the balanced terminal P3 can be rotated by the same amount. Consequently, the phase component of the output impedance of each of the balanced terminals P1 and P2 of the balun transformer 1E can be adjusted so as to match the phase component of the input impedance of an electronic component such as an IC that is connected to each of the balanced terminals P1 and P2.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A balun transformer comprising:
   an unbalanced terminal to and from which an unbalanced signal is inputted and outputted;
   a first balanced terminal to and from which a balanced signal is inputted and outputted;
   a second balanced terminal to and from which the balanced signal is inputted and outputted;
   a directional coupler that includes a first terminal, a second terminal, a third terminal, and a fourth terminal, the first terminal being connected to the unbalanced terminal, the directional coupler having a predetermined phase difference between an output signal of the second terminal and an output signal of the third terminal, the second terminal being connected to the first terminal by a line that constitutes the directional coupler;
   a low pass filter that is connected between the second terminal and the first balanced terminal; and
   a high pass filter that is connected between the third terminal and the second balanced terminal.

2. The balun transformer according to claim 1, wherein:
   the low pass filter includes an inductor connected in series between the second terminal and the first balanced terminal; and
   the high pass filter includes a capacitor connected in series between the third terminal and the second balanced terminal.

3. The balun transformer according to claim 1, further comprising:
   a capacitor that is connected in series between the unbalanced terminal and the first terminal;
   an inductor including a first end that is connected between the capacitor and the first terminal; and
   a direct current supply terminal that is connected to a second end of the inductor.

4. The balun transformer according to claim 1, wherein:
   the low pass filter includes a first inductor and a first capacitor;
   the high pass filter includes a second inductor and a second capacitor;
   the balun transformer further comprises:
      a dielectric layer;
      a first inductor electrode that defines the first inductor;
      a second inductor electrode that defines the second inductor;
      a first capacitor electrode that defines the first capacitor;
      a second capacitor electrode that defines the second capacitor; and
      a first transmission line electrode and a second transmission line electrode that define the directional coupler; wherein
   the dielectric layer, the first inductor electrode, the second inductor electrode, the first capacitor electrode, the second capacitor electrode, the first transmission line electrode, and the second transmission line electrode are laminated on each other to define a multilayer substrate defining the balun transformer.

5. The balun transformer according to claim 4, wherein the first transmission line electrode and the second transmission line electrode are spiral or substantially spiral and overlap each other as viewed from a lamination direction.

6. The balun transformer according to claim 4, wherein the first inductor electrode and the second inductor electrode are laminated together, with the first transmission line electrode and the second transmission line electrode being sandwiched between the first inductor electrode and the second inductor electrode.

7. The balun transformer according to claim 4, wherein the first capacitor electrode and the second capacitor electrode are laminated together, with the first transmission line electrode and the second transmission line electrode being sandwiched between the first capacitor electrode and the second capacitor electrode.

8. The balun transformer according to claim 4, wherein the first transmission line electrode is connected to the unbalanced terminal.

9. The balun transformer according to claim 4, wherein the second transmission line electrode is connected to the balanced terminal.

10. The balun transformer according to claim 4, wherein the first transmission line electrode is located adjacent to the second transmission line electrode and electromagnetically coupled thereto.

11. The balun transformer according to claim 4, wherein a line length of each of the first transmission line electrode and the second transmission electrode is equal to one quarter of a wavelength of a signal transmitted.

12. The balun transformer according to claim 1, wherein the unbalanced terminal and the first balanced terminal are directly connected by a wire and are not electromagnetically coupled to each other.

13. The balun transformer according to claim 1, further comprising a multilayer substrate including the unbalanced terminal, the first balanced terminal, the second balanced terminal, the directional coupler, the low pass filter and the high pass filter.

14. The balun transformer according to claim 4, wherein the multilayer substrate includes dielectric layers, linear electrodes located on the dielectric layers and defining the first inductor and the second inductor, and plate electrodes located on the dielectric layers and defining the first capacitor and the second capacitor.

15. The balun transformer according to claim 14, wherein the first and second transmission line electrodes are spaced from the plate electrodes to reduce or prevent parasitic capacitance.

16. A balun transformer comprising:
   an unbalanced terminal to and from which an unbalanced signal is inputted and outputted;
   a first balanced terminal to and from which a balanced signal is inputted and outputted;
   a second balanced terminal to and from which the balanced signal is inputted and outputted;
   a wire arranged to directly connect the unbalanced terminal to the first balanced terminal;
   a directional coupler that includes a first terminal, a second terminal, a third terminal, and a fourth terminal, the first terminal being connected to the unbalanced terminal, the second terminal being connected to the first terminal by a line that constitutes the directional coupler;
   a low pass filter that is connected between the second terminal and the first balanced terminal; and
   a high pass filter that is connected between the third terminal and the second balanced terminal; wherein
   a phase of a signal transmitted is changed by each of the directional coupler, the low pass filter and the high pass filter.

17. The balun transformer according to claim 16, wherein the directional coupler has a predetermined phase difference between an output signal of the second terminal and an output signal of the third terminal.

18. The balun transformer according to claim 16, wherein:
the low pass filter includes an inductor connected in series between the second terminal and the first balanced terminal; and
the high pass filter includes a capacitor connected in series between the third terminal and the second balanced terminal.

19. The balun transformer according to claim 16, further comprising:
a capacitor that is connected in series between the unbalanced terminal and the first terminal;
an inductor including a first end that is connected between the capacitor and the first terminal; and
a direct current supply terminal that is connected to a second end of the inductor.

20. The balun transformer according to claim 16, wherein:
the low pass filter includes a first inductor and a first capacitor;
the high pass filter includes a second inductor and a second capacitor;
the balun transformer further comprises:
a dielectric layer;
a first inductor electrode that defines the first inductor;
a second inductor electrode that defines the second inductor;
a first capacitor electrode that defines the first capacitor;
a second capacitor electrode that defines the second capacitor; and
a first transmission line electrode and a second transmission line electrode that define the directional coupler; wherein
the dielectric layer, the first inductor electrode, the second inductor electrode, the first capacitor electrode, the second capacitor electrode, the first transmission line electrode, and the second transmission line electrode are laminated on each other to define a multilayer substrate defining the balun transformer.

* * * * *